United States Patent
Singh et al.

(12)
(10) Patent No.: US 6,620,300 B2
(45) Date of Patent: Sep. 16, 2003

(54) COATING FOR OPTICAL FIBERS AND METHOD THEREFOR

(75) Inventors: Bawa Singh, Voorhees, NJ (US); Nalin Kumar, Moorestown, NJ (US); Vipulkumar Patel, South Brunswick, NJ (US); Krishna Linga, South Plainsboro, NJ (US); Ali Ouali, Upper Darby, PA (US)

(73) Assignee: LightMatrix Technologies, Inc., Mount Laurel, NJ (US)

( * ) Notice: Subject to any disclaimer, the term of this patent is extended or adjusted under 35 U.S.C. 154(b) by 72 days.

(21) Appl. No.: 09/973,513

(22) Filed: Oct. 9, 2001

(65) Prior Publication Data

US 2002/0051613 A1 May 2, 2002

Related U.S. Application Data

(60) Provisional application No. 60/244,239, filed on Oct. 30, 2000, and provisional application No. 60/293,785, filed on May 25, 2001.

(51) Int. Cl.$^7$ .............................................. C23C 14/35
(52) U.S. Cl. ..................................... 204/192.12; 134/42
(58) Field of Search ...................... 204/192.12, 192.13, 204/192.16, 192.26; 134/42

(56) References Cited

U.S. PATENT DOCUMENTS

| | | | |
|---|---|---|---|
| 4,592,932 A | 6/1986 | Biswas et al. | 427/163 |
| 4,609,437 A | 9/1986 | Kruishoop et al. | 204/28 |
| 4,759,950 A | 7/1988 | Stevens | 427/55 |
| 4,863,576 A | * 9/1989 | Collins et al. | 204/192.15 |
| 5,100,507 A | 3/1992 | Cholewa et al. | 156/651 |
| 5,178,743 A | 1/1993 | Kumar | 204/298.21 |
| 5,317,006 A | 5/1994 | Kumar | 204/298.12 |
| 5,380,559 A | 1/1995 | Filas et al. | 427/305 |
| 5,606,635 A | 2/1997 | Haake | 385/53 |
| 5,970,194 A | 10/1999 | Dunn et al. | 385/95 |
| 6,118,917 A | 9/2000 | Lee et al. | 385/49 |

OTHER PUBLICATIONS

Kumar et al., "Summary Abstract: Aluminum deposition on optical fibers by a hollow cathode magnetron sputtering system", J. Vac. Sci. Technol. A, vol. 6, No. 3, pp. 1772–1774.*

* cited by examiner

Primary Examiner—Steven H. VerSteeg
(74) Attorney, Agent, or Firm—Michael G. Crilly, Esq.

(57) ABSTRACT

An improved coating for optical fibers and a method for applying the improved coating are described. The present invention is a dimensionally precise and uniform coating with low-porosity. The improved coating is applied via sputtering within a vacuum chamber. Environmental conditions are monitored within a cylindrical magnetron during sputtering. Sputtering is adjusted or temporarily ceased when environmental conditions approach a damage threshold. Sputtered particles within a plasma cloud are dimensionally similar and adhere to an optical fiber in a volume efficient arrangement forming a more precise, denser, and more adherent coating. Embodiments of the present invention provide improved pull strength by compressively constraining the optical fiber within the coating and by closing microcracks.

28 Claims, 9 Drawing Sheets

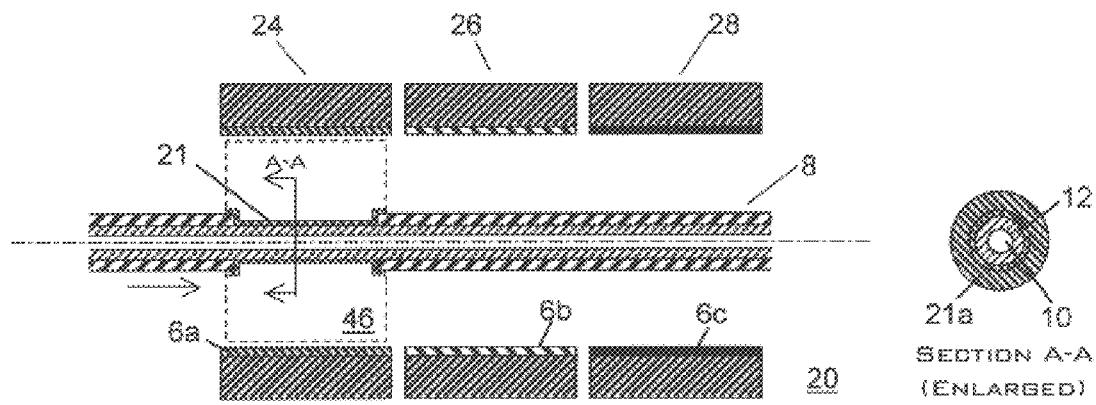
*FIG. 3A*
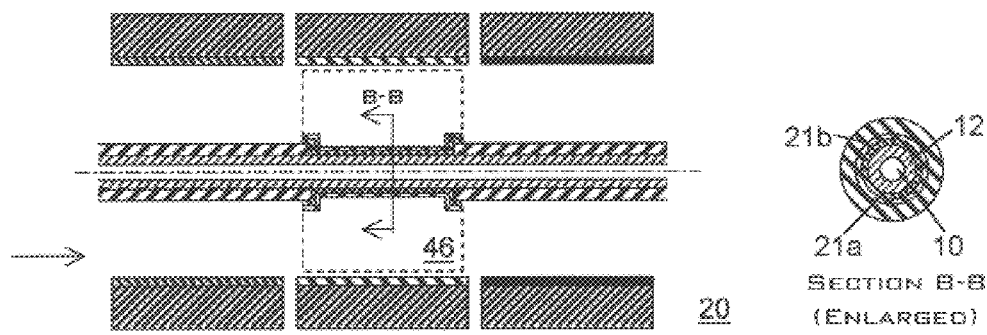
*FIG. 3B*
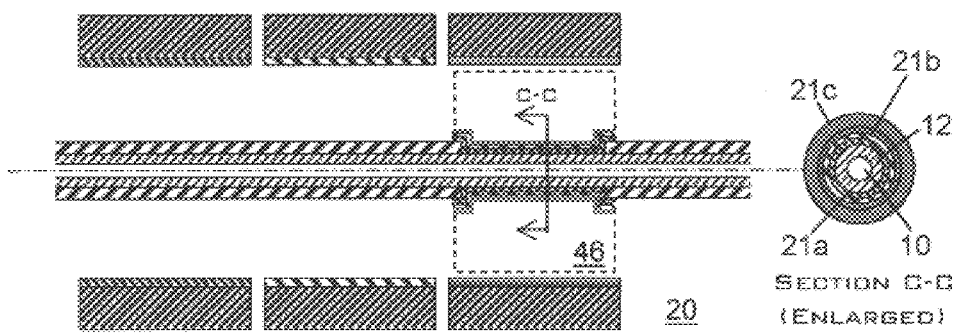
*FIG. 3C*
FIGURE 3

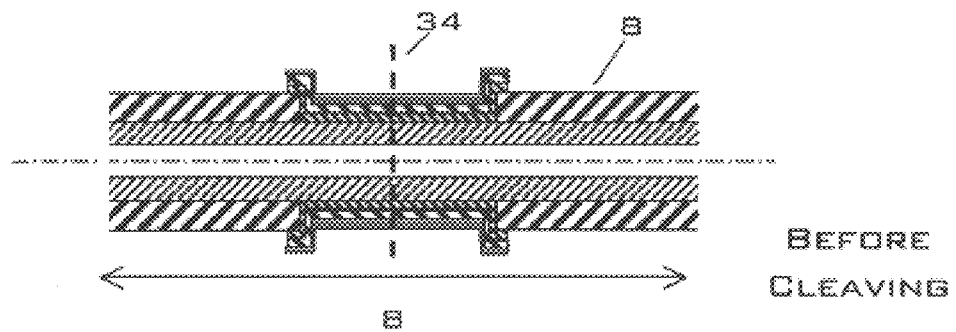
*FIG. 6A*
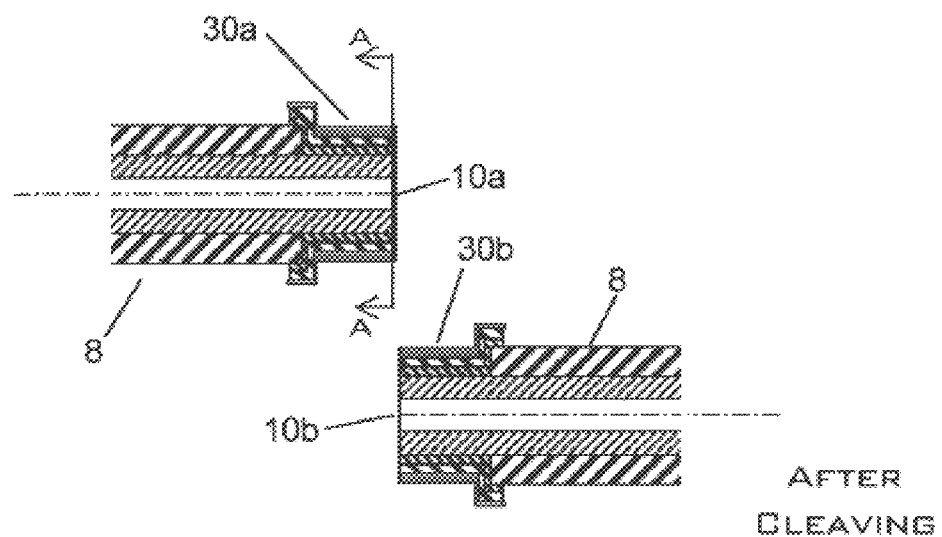
*FIG. 6B*
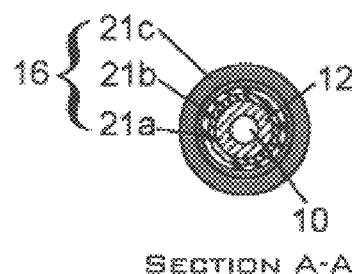
SECTION A-A
*FIG. 6C*
*FIGURE 6*

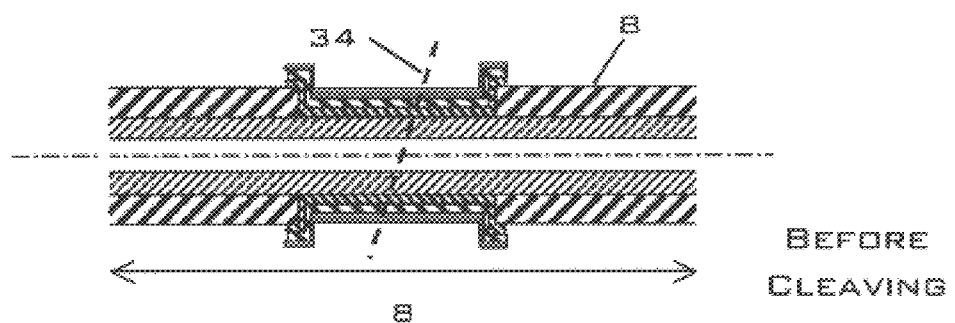
FIG. 7A  BEFORE CLEAVING
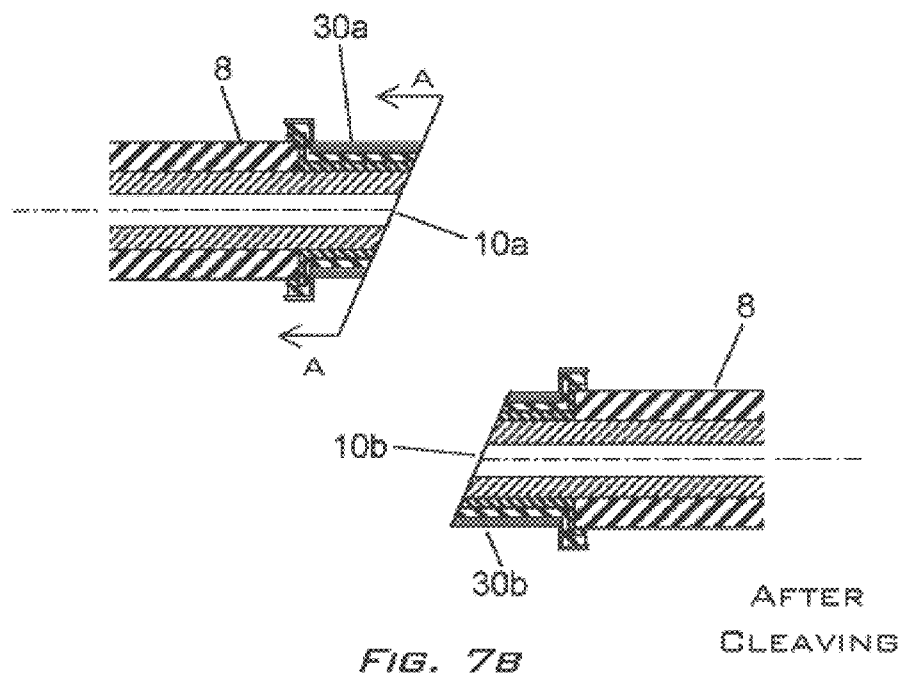
FIG. 7B  AFTER CLEAVING
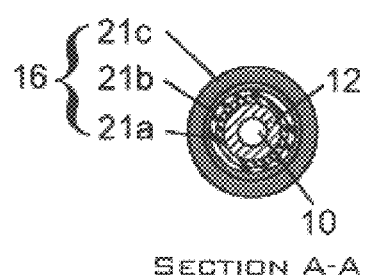
SECTION A-A
FIG. 7C
FIGURE 7

COATING FOR OPTICAL FIBERS AND METHOD THEREFOR

This application claims the benefit of U.S. Provisional Application No. 60/244,239, filed Oct. 30, 2000, and U.S. Provisional Application No. 60/293,785, filed May 25, 2001.

BACKGROUND OF THE INVENTION

1. Field of the Invention

The present invention relates to a coating applied onto a substrate and a method for applying the coating. The invention specifically described is an improved coating for optical fibers. The coating consists of a densely packed structure of sputtered particles forming a precise, dense, and adherent layer. The coating is deposited within a cylindrical magnetron via a sputtering process that avoids damaging the optical fiber.

2. Description of the Related Art

In recent years, optical fiber technology has gained popularity in many commercial applications due to unparalleled performance advantages over existing metal-wire systems. In particular, optical fibers and related components are widely accepted in military communications, civilian telecommunications, and control systems. Optical fibers are small, strong, and lightweight. In communication applications, they provide wide bandwidth, low transmission loss, resistance to radiation damage, and immunity to electromagnetic interference.

A typical optical fiber is composed of a core within a layer of cladding and thereafter one or more layers of a buffer. The core provides a pathway for light. The cladding confines light to the core. The buffer provides mechanical and environmental protection for both core and cladding.

Fiber construction and materials are known within the art. For example, a typical single-mode fiber (SMF) is composed of precision extruded glass having a cladding with a diameter of 125 $\mu m \pm 2$ $\mu m$ and a core with a diameter of 8 $\mu m \pm 1$ $\mu m$ residing within the center of the cladding. A buffer is typically composed of a flexible polymer applied onto the outer surface of a cladding via known methods yielding dimensional variations at least one magnitude larger than in core and cladding. Existing deposition methods produce a coating with large dimensional variations. Consequently, state-of-the-art optical fibers are composed of a dimensionally precise core and cladding assembly within a less precise buffer and coating. Such imprecisions skew the concentricity between core and coating. As such, commercial optical fibers do not lend themselves to precision alignment. Misalignment between fibers or fiber and optical component (i.e., photodetector) is the primarily source of light energy loss.

Optical fiber systems typically require a hermetic seal at fiber—fiber connections, fiber-component connections, and along the length of a fiber to prevent moisture and other contaminates from degrading the optical pathway. Commercially available coated fibers are porous and therefore fail to provide a hermetic seal sufficient to exploit component lifetime. Furthermore, porous coatings reduce adherence between coating and fiber thereby weakening connections.

Coated optical fibers are typically soldered to other components thereby providing a continuous pathway. The pull strength of the coated fiber at such connections is critical to the integrity of the pathway. Currently, coating design and fabrication methods limit pull strength to approximately 1.6 pounds as verified by quality assurance tests known within the art. Coating methods may also further weaken the fiber by creating micro-cracks within the fiber structure.

Various methods are known within the art to coat an optical fiber with a metal layer, see Kruishoop et al. (U.S. Pat. No. 4,609,437), Cholewa et al. (U.S. Pat. No. 5,100,507), Filas et al. (U.S. Pat. No. 5,380,559), and Dunn et al. (U.S. Pat. No. 5,970,194). The related arts have sought to minimize dependence on sputtering and to develop replacement methods.

Kruishoop et al., issued Sep. 2, 1986, describes a two-step method to form a metal coating onto a synthetic resin cladding along an optical fiber. A thin conductive layer is first applied by reducing a metal salt onto the cladding and thereafter forming a thin metal layer by electroplating. Kruishoop et al. explicitly excludes sputtering methods for applying the conductive layer since such methods produce thermal energy sufficient to damage the underlying structure.

Cholewa et al., issued Mar. 31, 1992, describes a method for processing an optical fiber comprised of an integral lens and a metallized outer coating. Metallization is achieved via sputtering. However, Cholewa et al. does not address the thermal heating problem and damage inherent to sputtering as identified by Kruishoop et al.

Filas et al., issued Jan. 10, 1995, describes an electroless method for depositing nickel and gold coatings onto optical fibers using aqueous chemistry. The Filas et al. method was developed since sputtering is not only expensive, but also produces a non-uniform coating and tends to weaken the fiber.

Dunn et al., issued Oct. 19, 1999, describes a method wherein a limited mid-section of an optical fiber is metallized via sputtering or evaporation. Dunn et al. does not address the problems inherent to sputtering as identified by Kruishoop et al. and later by Filas et al.

Planar sputtering methods are known within the art. Planar sputtering deposits a thin film coating onto a fiber as it rotates relative to a uni-directional coating source. Both stationary and moving fibers are coated with this technique.

Planar sputtering methods are complex, inefficient, and fail to provide the uniformity and quality required for many optical fiber applications. Planar sputtering requires mechanically complicated precision rotation means to adjust the fiber with respect to the planar source. Such rotating systems cannot ensure sufficient thickness uniformity for accurate fiber alignment. Planar sputtering is inefficient in that only a small portion of the metal ejected from the target is deposited onto the fiber thereby making its use costly. Planar sputtering subjects the fiber to asymmetric overheating across the cross section of the fiber thereby promoting microcracks within the cladding and reducing the quality of the coating. Furthermore, planar sputtering yields a porous coating reducing hermeticity and adherence.

Kumar describes a cylindrical magnetron for applying a circumferential coating, see U.S. Pat. Nos. 5,178,743 issued Jan. 12, 1993 and 5,317,006 issued May 31, 1994. While cylindrical magnetron inventions are disclosed, methods for depositing precise, dense, and adherent coatings without damaging an optical fiber are neither described nor claimed.

It is therefore an object of the present invention to avoid the disadvantages of the related art. More particularly, it is an object of the invention to provide a coated optical fiber with minimal dimensional variability thereby facilitating rapid alignment and assembly of such fibers within an optical system. It is an object of the invention to provide a dense, low-porosity coating onto a fiber substrate. It is an object of the invention to provide improved adherence between coating and fiber substrate. It is also an object of the invention to provide a controlled method for depositing a coating onto a fiber without damaging the fiber. It is an object of the invention to provide a coated fiber with greater pull strength. It is an object of the invention to provide a coating method facilitating the simultaneous application of one or more coatings onto a plurality of fibers. Furthermore, it is an object of the invention to provide a coating method that facilitates the application of several independent layers within a single vacuum chamber without breaking the vacuum.

SUMMARY OF THE INVENTION

The present invention provides a controlled method for the application of an improved coating onto an optical fiber while avoiding damage to the fiber structure. The improved coating is applied via sputtering within a cylindrical magnetron.

The claimed deposition method includes generating a plasma cloud composed of dimensionally similar sputtered particles that adhere to an optical fiber and form a uniform, adherent, low-porosity coating, monitoring at least one environmental parameter within the vacuum chamber during deposition, and adjusting the deposition step to avoid one or more conditions that promote fiber damage. Monitoring and adjusting steps are either manually controlled or automated. Environmental conditions include such examples as temperature, pressure, and gas composition, each indicative of the onset or progression of fiber damage.

An optional cleaving step is provided. In one embodiment, a portion of the fiber end is removed to expose an optically clear core. In another embodiment, the fiber mid-section is cleaved yielding two fiber ends, each having an optically clear core.

The deposition method is applicable to fiber ends, fiber mid-sections, as well as along the length of the optical fiber. One or more optical fibers may be simultaneously coated in one or more cylindrical magnetrons thereby increasing production yield.

The improved coating includes single and multiple layer configurations. In one embodiment, at least one layer is composed of a thermal barrier material applied directly onto an optical fiber, a metal layer, or another thermal barrier material. In yet another embodiment, the layers are composed of commercially pure metals.

Both coating embodiments facilitate a stronger optical fiber in conventional pull test arrangements. Thermal barrier coatings are inherently stronger due to mechanical properties of the materials and improved adherence between such materials and fiber, as well as between such materials and other layer materials. Metal-based coatings are inherently stronger because either the coating compressively constrains the fiber or the coating closes microcracks within the fiber prior to or as a result of the sputtering process.

BRIEF DESCRIPTION OF THE DRAWINGS

FIG. 3 shows a cross-section view of a fiber within a vacuum chamber with multiple magnetrons.

FIG. 6 is a cross-section view of fiber mid-section before and after cleaving along plane perpendicular to fiber axis.

FIG. 7 is a cross-section view of fiber mid-section before and after cleaving along plane oblique to fiber axis.

REFERENCE NUMERALS

Figure 1:
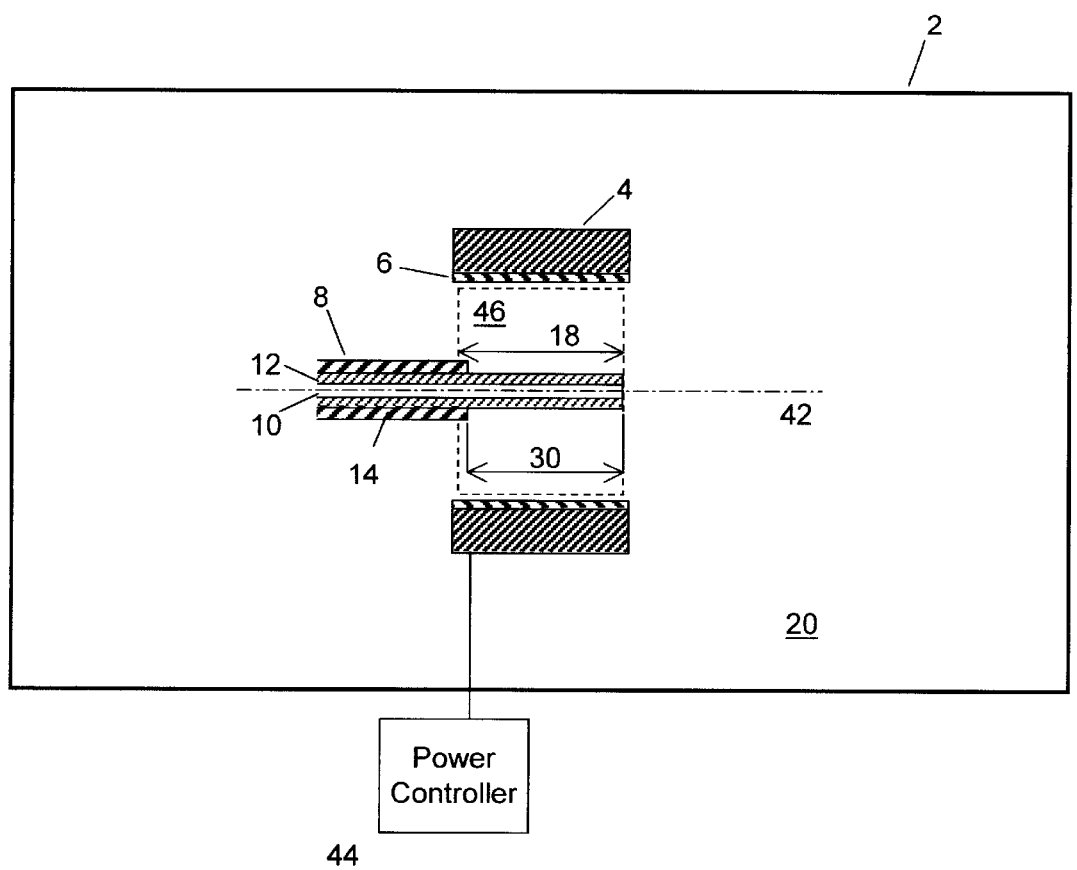
FIG. 1 shows a schematic section view of fiber end within cylindrical magnetron.

2 Vacuum chamber
4 Cylindrical magnetron
6 Hollow cathode
8 Optical fiber
10 Core
12 Cladding
14 Buffer
16 Coating
18 Fiber segment
20 Chamber environment
21 Layer
24 First magnetron
26 Second magnetron
28 Third magnetron
30 Fiber end
32 Fiber mid-section
34 Cleave plane
36 Environmental sensor
38 Sputtered particles
40 Columnar microstructure
42 Longitudinal axis
44 Power controller
46 Plasma cloud
48 Fixture
50 Minor segment
52 Major segment
54 Sensor controller

DETAILED DESCRIPTION OF THE INVENTION

Figure 8:
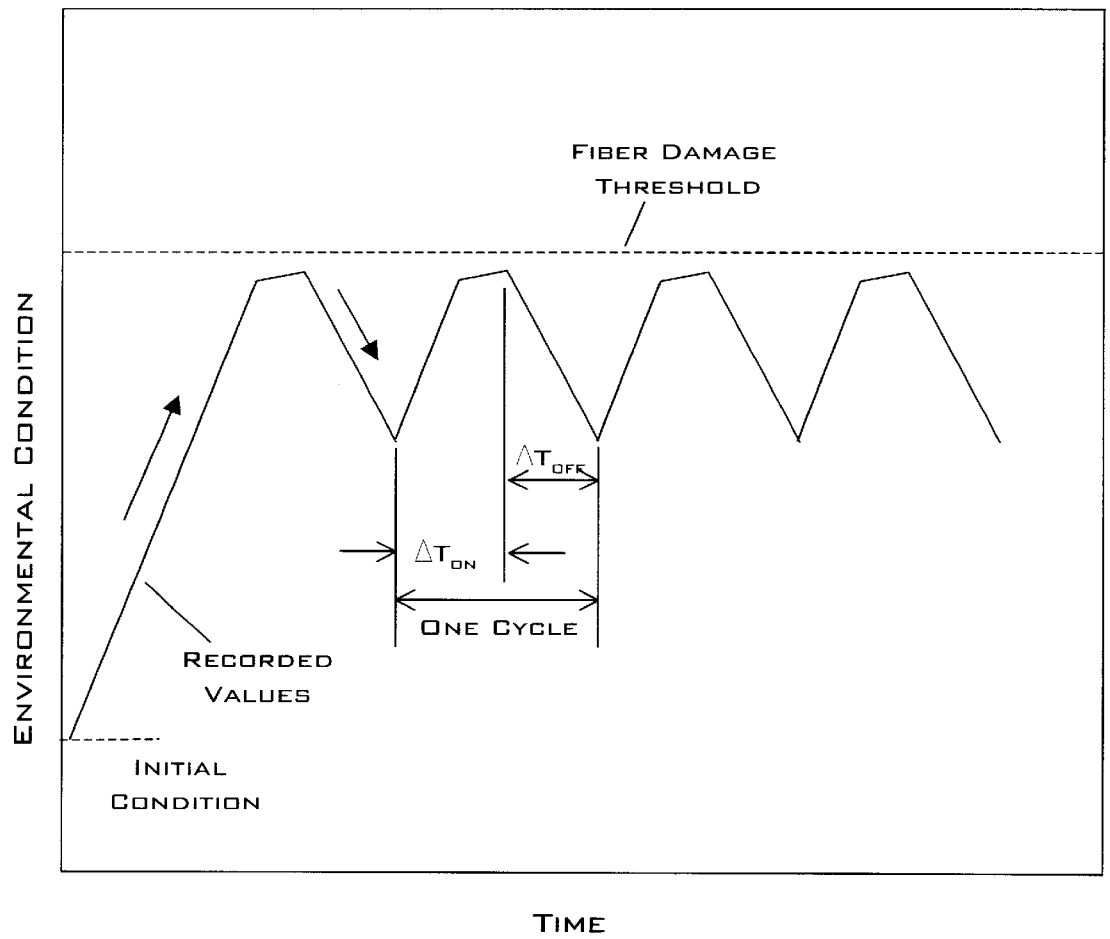
FIG. 8 shows a representative environmental history plot facilitating damage free sputtering.
Figure 9:
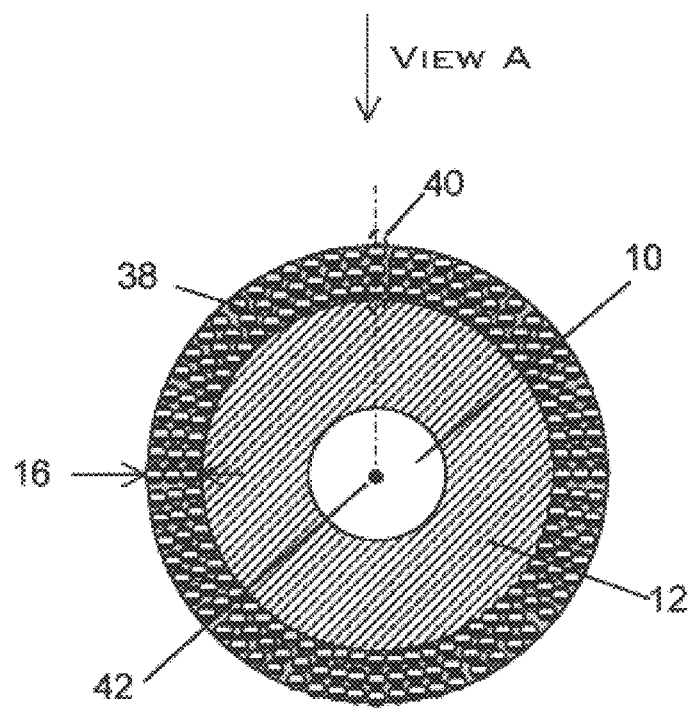
FIG. 9 shows a representative coating structure with sputtered particles aligned about a fiber cross section.
Figure 10:
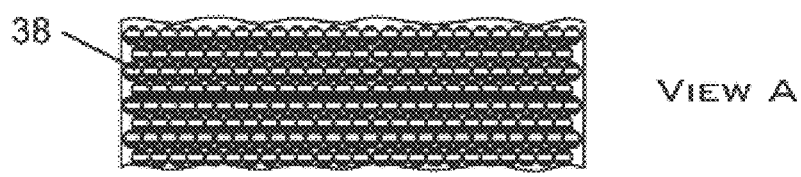
FIG. 10 is a top view of optical fiber showing sputtered particle arrangement.

FIGS. 1 through 12 describe various features supporting the claimed method and apparatus. FIGS. 1 through 5, 11, and 12 include hardware and apparatus arrangements related to the deposition process. FIGS. 6 and 7 describe fiber ends 30 achieved after cleaving step. FIG. 8 describes environmental control during the deposition method. FIGS. 9 and 10 graphically describe the columnar microstructure 40 typical of coatings 16 produced with the claimed method. Component dimensions are not to scale. Optical fibers 8 with circular cross sections are presented and described. However, the claimed invention is not limited to this form.

The claimed deposition method includes generating a plasma cloud 46 composed of dimensionally similar sputtered particles 38 that adhere to an optical fiber 8 and form a uniform, adherent, low-porosity coating 16, monitoring at least one environmental parameter within the vacuum chamber 2 during the process, and adjusting the deposition step to avoid one or more conditions that promote damage to the optical fiber 8. The deposition method is applicable to fiber ends 30, fiber mid-sections 32, as well as along the length of the optical fiber 8. An optional cleaving step is available. In one embodiment, a portion of the fiber end 30 is removed to expose an optically clear core 10 after residues and debris from the cleaving step are removed. In another embodiment, the fiber mid-section 32 is cleaved yielding two fiber ends 30, each having an optically clear core 10 after residues and debris from the cleaving step are removed.

Figure 2:
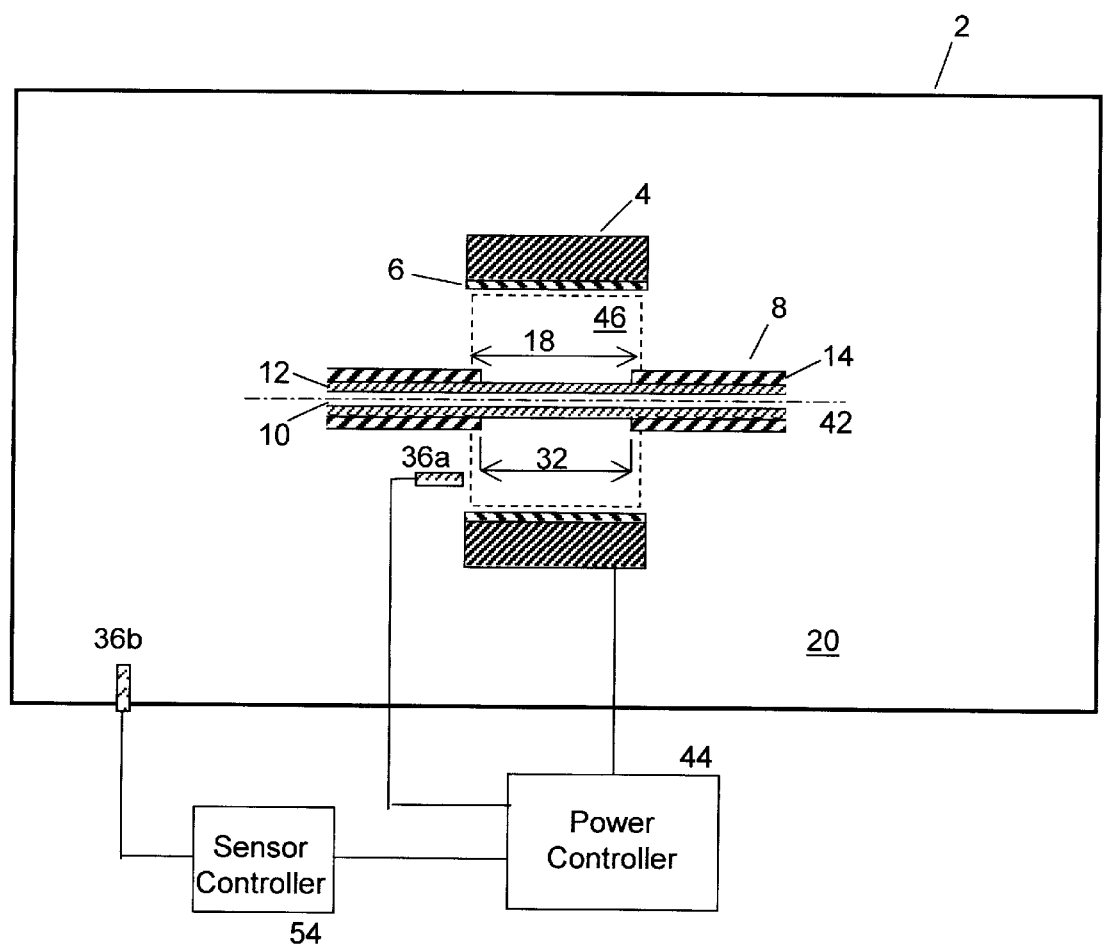
FIG. 2 shows a schematic section view of fiber mid-section within cylindrical magnetron.

Pre-deposition cleaning is sometimes required to prepare optical fiber 8 and hollow cathode 6. All or some of the buffer 14 is removed from the optical fiber 8 along a fiber segment 18 onto which coating 16 is to be deposited. Removal of buffer 14 and cladding 12 may be achieved by mechanical or chemical methods or combinations thereof. For example, mechanical stripping devices known within the art are well suited to removing buffer 14. Chemical etching methods known within the art, one example including an acid bath, are applicable to removing buffer 14 and/or cladding 12. The optical fiber 8 is cleaned using techniques known within the art to remove any residues remaining along the exposed cladding 12 or core 10. Next, the fiber segment 18 is positioned within the cylindrical magnetron 4. FIG. 1 shows a fiber end 30 within a cylindrical magnetron 4 prior to deposition. FIG. 2 shows a fiber mid-section 32 within a cylindrical magnetron 4 before deposition.

Pre-deposition cleaning of the fiber segment 18 within the cylindrical magnetron 4 may also be desired. The cylindrical magnetron 4 without hollow cathode 6 is energized with either RF voltage in the presence of a chamber environment 20 consisting mainly of oxygen. The resultant reactive species generated within the vacuum chamber 2 removes organic compounds, buffer 14, and cladding 12, where desired, from the optical fiber 8.

Hollow cathodes 6 also require cleaning to remove oxides, residues, and organic materials that contaminate and weaken the bond between coating 16 and fiber segment 18. A cylindrical magnetron 4 is energized with hollow cathode 6, prior to insertion of an optical fiber 8, thereby forming a plasma cloud 46. Thereafter, the cylindrical magnetron 4 is de-energized and the plasma cloud 46 dissipated. The hollow cathode 6 may require energizing and de-energizing several times to adequately remove contaminants.

Function of the hollow cathode 6 is adjusted during the deposition process to avoid conditions exceeding one or more established fiber damage thresholds, examples including but not limited to pressure, temperature, and gas species. Both interactive and active control of the hollow cathode 6 are possible.

In the interactive mode, a user controls the cylindrical magnetron 4 by sequentially switching power ON and OFF for defined durations via a power controller 44 shown in FIG. 1. A single pair of ON-OFF switching and corresponding energizing and de-energizing constitute a cycle. Cycle characteristics may be determined experimentally. FIG. 8 describes a representative graphical map for an experimentally characterized environmental parameter. Experimental characterization may be performed by recording temperature versus time within a cylindrical magnetron 4 over a range of pressures, temperatures, and gas flow rates. When the cylindrical magnetron 4 is energized for a specified time increment ($\Delta T_{on}$), one or more measured environmental parameters approach their corresponding damage thresholds, above which the optical fiber 8 is damaged and the quality of the coating 16 is diminished. For example, a typical single-mode optical fiber 8 has a damage threshold temperature around 120 degrees Celsius maintained for approximately twenty seconds. The cylindrical magnetron 4 is de-energized for a specified time increment ($\Delta T_{off}$) allowing the environmental parameter to recede. A plurality of cycles may be required to achieve the desired coating 16.

In the active mode, one or more environmental sensors 36a, 36b are placed within the vacuum chamber 2 sometimes positioned immediately adjacent to the cylindrical magnetron 4, as shown in FIG. 2. A typical environmental sensor 36a. 36b records parameter data, examples including pressure, temperature, and gas species, indicative of the physical condition of the optical fiber 8. Environmental sensors 36a, 36b include thermocouples, radiometers, optical pyrometers, pressure transducers, and residual gas analyzers (RGA). The environmental sensor 36a, 36b communicates with a power controller 44 directly thereby providing data required to adjust power to the cylindrical magnetron 4. Alternatively, the environmental sensor 36a, 36b may send raw data to a sensor controller 54 for processing after which it is sent to a power controller 44. The power controller 44 might continuously adjust power magnitude between ON and OFF states or simply switch between the two states, as represented in FIG. 8.

Coating 16 thickness is controlled by the deposition rate and total exposure time within the cylindrical magnetron 4. Coating 16 material is voltage type dependent. For example, DC voltage facilitates the formation of conductive coatings 16, including but not limited to nickel, aluminum, and gold. RF voltage facilitates the formation of metal, insulating, and dielectric coatings 16, including but are not limited to PTFE, carbon, and diamond-like thin films. Multiple layer 21 coatings 16 are achieved by successive deposition steps applying one or more materials.

Two or more cylindrical magnetrons 4 may be coaxially arranged along the axis of a fixture 48 in a single vacuum chamber 2 to deposit one or more layers 21. One or more cylindrical magnetrons 4 may be dedicated to cleaning an optical fiber 8. Remaining cylindrical magnetrons 4 are typically dedicated to applying coatings 16.

FIG. 3 shows an arrangement of three cylindrical magnetrons 4 consisting of a first magnetron 24, a second magnetron 26, and a third magnetron 28. Magnetrons 24, 26, 28 include both convection and conduction cooled devices. Each magnetron 24, 26, 28 may have a hollow cathode 6a, 6b, and 6c, respectively. Hollow cathodes 6 may consist of one or more high purity materials with the preferred embodiment at least 98% pure on a mass basis. Hollow cathodes 6 consist of a dimensionally precise cylinder or polygon, symmetrically aligned along the longitudinal axis 42 of the optical fiber 8. The length of the cylindrical magnetron 4 approximately corresponds to the maximum length of the coating 16. However, shorter coating 16 lengths are achieved by masking techniques, one example including retaining buffer 14 along a fiber segment 18 and removing it after the deposition process is completed. The diameter of the hollow cathode 6 limits the number of optical fibers 8 that may be simultaneously coated. The plasma cloud 46 surrounds the fiber segment 18 to form a uniform coating 16.

In FIG. 3a, a single optical fiber 8 is statically positioned within three cylindrical magnetrons 4 so that a fiber segment 18, specifically a fiber mid-section 32, is aligned with the hollow cathode 6a within the first magnetron 24. Sputtered particles 38 are generated, a plasma cloud 46 formed enveloping the fiber segment 18, and a layer 21a of a desired thickness deposited onto the optical fiber 8. Next, the fiber segment 18 is moved in the direction of the longitudinal axis 42 of the optical fiber 8 so to align it with the second magnetron 26 wherein another layer 21b is applied, see FIG. 3b. Finally, the fiber segment 18 is moved again in the direction of the longitudinal axis 42 of the optical fiber 8 so to align it with the third magnetron 28 wherein yet another layer 21c is applied, see FIG. 3c. FIG. 3c shows the final coating 16 consisting of three layers 21a, 21b, 21c sequentially applied onto the optical fiber 8. Magnetrons 24, 26, 28 are energize and de-energized as described above. One or more layers 21 may comprise a single coating 16. In some applications, it is desirable to apply coating 16 material onto buffer 14 immediately adjacent to the fiber segment 18. The optical fiber 8 is masked using techniques known within the art to prevent the accumulation of coating 16 along specific regions.

Figure 11:
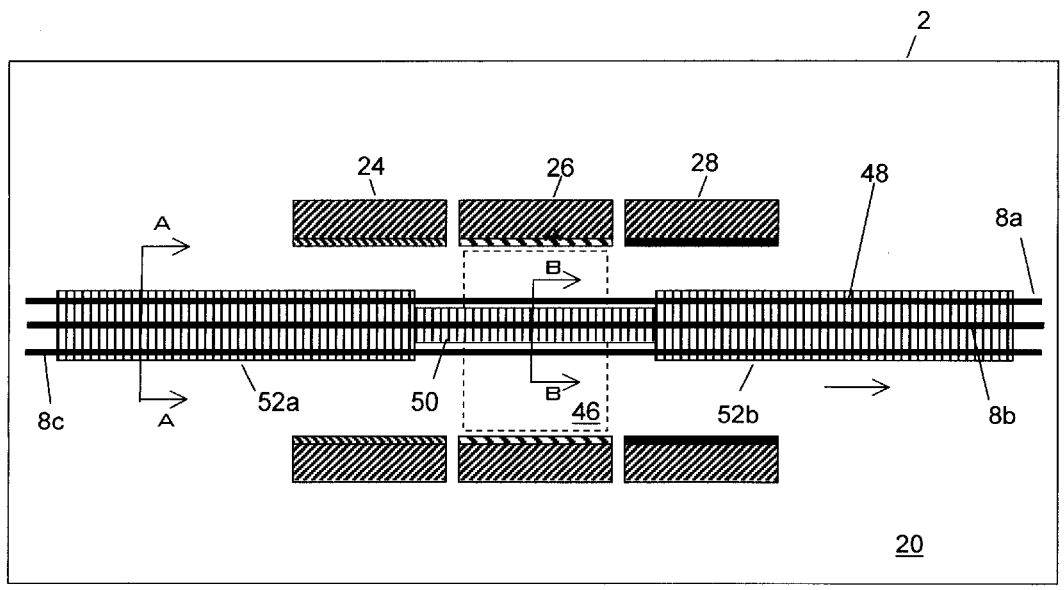
FIG. 11 shows optical fiber fixture within vacuum chamber with multiple magnetrons.
Figure 12:
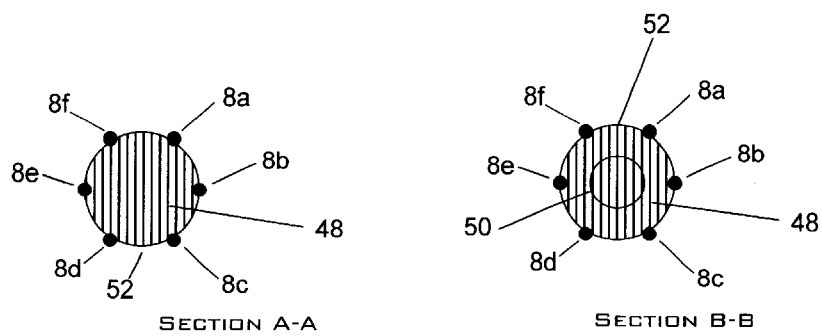
FIG. 12 provides section views of fiber showing fiber alignment.

One or more optical fibers 8a–8c are attached to a fixture 48 and axially aligned with the magnetrons 24, 26, 28, as shown in FIG. 11. The fixture 48 consists of a minor segment 50 between two major segments 52a, 52b. While minor segment 50 and major segments 52 are described to have circular cross sections, square, elliptical, polygonal, or rectangular shapes are also possible. Optical fibers 8 are secured to the major segments 52a, 52b. Fiber segments 18 are aligned along the minor segment 50. The cross section of the minor segment 50 is minimized to avoid adversely altering deposition around the circumference of the optical fibers 8a–8f, see FIG. 12. The fixture 48 is grounded to attract sputtered particles 38 to the optical fibers 8a–8f.

Movement of an optical fiber 8 between magnetrons 24, 26, 28 is achieved via the fixture 48. For example, one or more optical fibers 8a–8c may be secured onto a fixture 48 extending from the vacuum chamber 2 allowing operations personnel to manually position optical fibers 8a–8c within the desired magnetron 24, 26, 28, see FIG. 11. Environmental conditions are maintained by providing sealing techniques between vacuum chamber 2 and fixture 48, as known with the art. Alternatively, the fixture 48 may be positioned via a linear motion device within the vacuum chamber 2 and remotely controlled external to the vacuum chamber 2.

In a high-volume production environment, a plurality of cylindrical magnetrons 4 may be coaxially aligned within a single vacuum chamber 2. The primary advantage of this approach being the ability to sequentially deposit a plurality of layers 21 without breaking the vacuum within the vacuum chamber 2 thereby avoiding contaminants between layers 21.

Coatings 16 composed of a single layer 21 include both metals and non-metals. Preferred single layer 21 materials include aluminum, silver, gold, chromium, copper, nickel, palladium, platinum, titanium, tantalum, tungsten, nickel-chromium alloys, titanium-chromium alloys, and thermal barrier materials preferably providing a diffusion barrier. Specific thermal barrier materials include nitrides, oxides, carbides, and oxy-nitrides. Nitride-based coatings 16 include but are not limited to titanium nitrides, zirconium nitrides, carbon nitrides, aluminum nitrides, hafnium nitrides, chromium nitrides, and tantalum nitrides. Oxide-based coatings 16 include but are not limited to titanium oxides, zirconium oxides, aluminum oxides, hafnium oxides, chromium oxides, and tantalum oxides. Carbide-based coatings 16 include but are not limited to titanium carbides, zirconium carbides, aluminum carbide, hafnium carbide, chromium carbide, and tantalum carbide. Oxy-nitride-based coatings 16 include $M_yO_xN_{1-x}$, where $0<x<1$, $y>0$, and M is a metal.

Coatings 16 may be composed of two or more layers 21. Preferred embodiments have at least one layer 21 composed of a thermal barrier, preferably a nitride, carbide, oxide, or oxy-nitride, examples as described above. In the preferred embodiment, the thermal barrier material should have a coefficient of thermal expansion comparable to adjacent layers 21. FIG. 6c shows a three layer 21a, 21b, 21c system. In preferred embodiments, a first layer 21a forms an adhesive bond with the optical fiber 8, a second layer 21b provides a diffusion barrier, and a third layer 21c forms an oxidation resistant film. First layer 21a materials include titanium, nickel, aluminum, nickel-chromium, tantalum, titanium-tungsten, chromium and nickel-chromium alloys. The second layer 21b may consist of one or more sequentially applied thin films composed of materials including oxides, nitrides, carbides, oxy-nitrides, and combinations thereof. The third layer 21c may consist of a precious metal and alloys thereof. The third layer 21c may possess a low-melt temperature to facilitate soldering thereby providing a hermetic seal between two or more optical fibers 8 or one or more optical fibers 8 and one or more components, example materials including such eutectic solders as gold-tin, silver-tin, indium-tin, and lead-tin.

Coatings 16 composed of two or more layers 21 as described above increase the pull or break strength of the optical fiber 8. For example, three layer 21a, 21b, 21c systems as described above compressively strain the underlying fiber segment 18 thereby increasing the tensile failure threshold of the optical fiber 8. Such three layer 21a, 21b, 21c systems also seal micro-cracks along the surface of the optical fiber 8, core 10, or cladding 12 and thereby resist crack-based failures from propagating through the optical fiber 8.

Chamber environment 20, namely pressure and gas flow rate, and power to the cylindrical magnetron 4 are dependent on the size of and the material comprising the hollow cathode 6. For example, a cylindrical magnetron 4 with a 50.8 mm inner diameter, 76.2 mm long, and 55.6 mm long magnets has an operating range of 5 to 50 watts at a gas pressure of 2 to 50 milliTorr. Gas flow rate maintains the desired pressure within the vacuum chamber 2 and therefore is dependent on the construction of the vacuum chamber 2. Titanium deposition is achieved when the chamber pressure is between 2 and 20 milliTorr, argon flow rate is between 50 and 200 sccm, and power is between 10 and 25 Watts. Platinum deposition is achieved when the chamber pressure is between 10 and 30 mTorr, argon flow rate is between 50 and 200 sccm, and power is between 10 and 25 Watts. Nickel deposition is achieved when the chamber pressure is between 10 and 30 mTorr, argon flow rate is between 50 and 200 sccm, and power is between 15 and 25 Watts. Gold deposition is achieved when the chamber pressure is between 10 and 30 mTorr, argon flow rate is between 50 and 200 sccm, and power is between 10 and 25 Watts. Power fluctuations should be minimized to less than ±1% of the total power input to the cylindrical magnetron 4, otherwise coating 16 uniformity is compromised by the formation of dimensionally dissimilar sputtered particles 38. Deposition times less than one minute with one minute cool down intervals avoid overheating of the optical fiber 8.

The plasma cloud 46 is optimum when it glows with a bright, crisp uniform color surrounding the optical fiber 8. For example, an optimized plasma cloud 46 is white when the vacuum chamber 2 contains argon gas and pink when oxygen fills the vacuum chamber 2.

Figure 4:
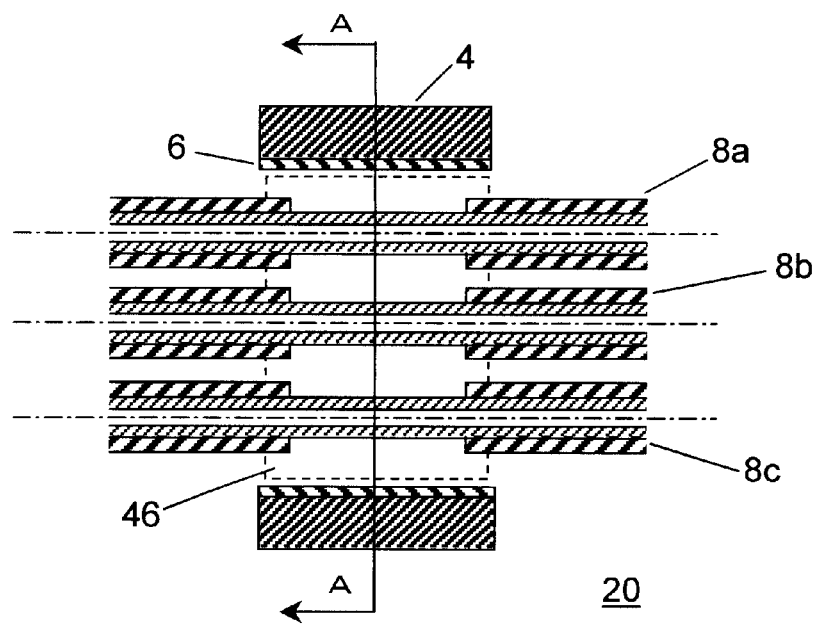
FIG. 4 is a schematic section view of multiple fiber mid-sections within a single cylindrical magnetron.
Figure 5:
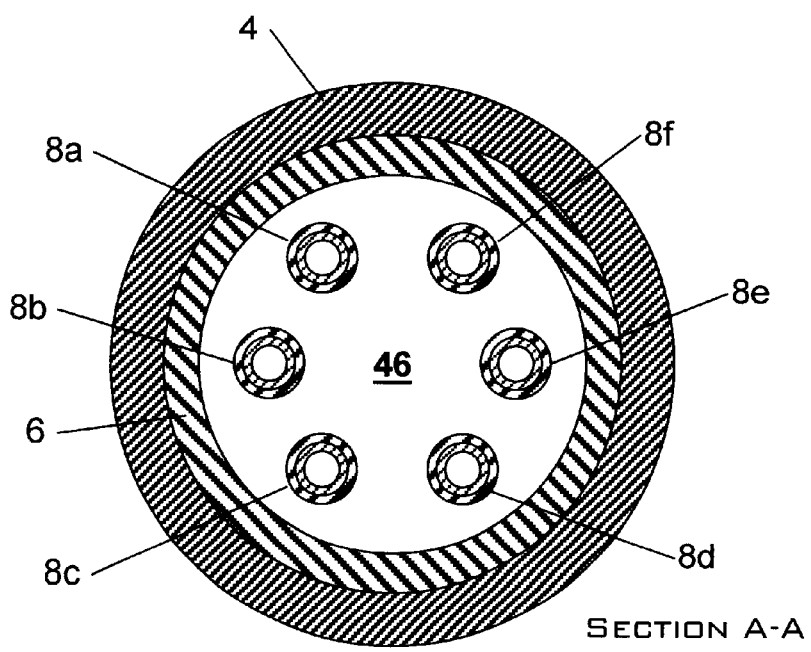
FIG. 5 is a sectional view showing multiple fibers within a single cylindrical magnetron.

Coatings 16 may be deposited onto two or more optical fibers 8 simultaneously, as described in FIGS. 4 and 5. FIG. 4 shows three of six optical fibers 8a–8c within a single cylindrical magnetron 4. FIG. 5 shows a section view from the same cylindrical magnetron 4 wherein six optical fibers 8a–8f are arranged in a circular fashion, however not limited to this geometric arrangement. The maximum number of optical fibers 8 effectively coated within a cylindrical magnetron 4 depends on the diameter of the cylindrical magnetron 4 as well as the optical fibers 8, which in turn determines the degree of interference between optical fibers 8. Interference should be minimized to produce a uniform coating 16. The optical fiber 8 arrangements in FIGS. 4 and 5 are compatible with the multiple magnetron 24, 26, 28 embodiment described in FIG. 3.

After deposition is completed, optical fibers 8 may be cleaved and cleaned to yield a single optically clear core 10 when coating 16 is applied to the fiber end 30 or to yield two optically clear cores 10a, 10b attached to an equal number of fiber ends 30a, 30b when coating 16 is applied to a fiber mid-section 32. Cleaning many include mechanical or chemical methods known within the art. The second application doubles the production yield achievable via the claimed method. FIG. 6 shows an optical fiber 8 with coating 16 applied to the fiber mid-section 32 before and after cleaving. In this embodiment, the cleave plane 34 bisects the fiber segment 18 perpendicular to the longitudinal axis 42 of the optical fiber 8. FIG. 7 shows an alternate embodiment wherein the cleave plane 34 bisects the fiber segment 18 oblique to the longitudinal axis 42.

Denser, less porous coatings 16 result when dimensionally similar sputtered particles 38 are densely packed within a given volume. FIGS. 9 and 10 show one such example of a plurality of dimensionally similar sputtered particles 38 arranged in a columnar microstructure 40 surrounding and attached to a single optical fiber 8. The sputtered particles 38 are aligned in a row with respect to radial lines projected from the longitudinal axis 42 of the optical fiber 8. FIG. 10 shows the interlocking arrangement between sputtered particles 38 when viewed along the length of the optical fiber 8. In preferred embodiments, pull strength of the coating 16 is at least 2 pounds.

Sputtered particles 38 adhere to the optical fiber 8 in a volumetric efficient arrangement thereby maximizing density and minimizing porosity. Sputtered particles 38 either adhere to one another or coalesce forming a continuous layer 21. Sputtered particles 38 align and pack forming various arrangements. For example, titanium and nickel adhere to an optical fiber 8 and form a columnar microstructure 40.

FIGS. 6b and 7b show representative optical fibers 8 with a single coating 16 comprised of multiple layers 21. Coating 16 dimensions, namely length and thickness, are application dependent. Coatings 16 are best characterized as a uniform cylinder of material with minimal dimensional variations surrounding and bonded to an optical fiber 8. A coating 16 may be applied to a fiber end 30, a single fiber segment 18, multiple fiber segments 18, along the length of an optical fiber 8, and combinations thereof. Thickness uniformity insures concentricity between cladding 12 and coating 16 at least as good as that between cladding 12 and core 10. Dimensional precision of the coating 16 increases inversely with the diameter of the sputtered particles 38 and improves with decreasing variation in the sputtered particles 38.

The sputtering method described herein yields a stronger optical fiber 8 when subjected to pull tests known within the art. Preferred embodiments of the coating 16 improving the optical fiber 8 strength consist of a plurality of layers 21 composed of commercially pure metals. A specific example includes a three layer 21a, 21b, 21c configuration wherein 500 Angstroms thick titanium is bonded to the optical fiber 8, 1000 Angstroms thick nickel is bonded to the titanium, and 500 angstroms thick gold is bonded to the nickel. Another specific example includes a three layer 21a, 21b, 21c configuration wherein 500 Angstroms thick titanium is bonded to the optical fiber 8, 1000 Angstroms thick platinum is bonded to the titanium, and 500 angstroms thick gold is bonded to the platinum.

Two mechanism are responsible for improved strength. In some embodiments, the coating 16 surrounding the optical fiber 8 effectively closes micro-cracks within the cladding 12 of the optical fiber 8 prior to or formed during sputtering. Closing includes bridging, filling, or locally pulling the crack together thereby eliminating the crack. In alternate embodiments, the applied coating 16 is under a compressive strain that prevents failure along cracks within the optical fiber 8. Compressive forces are uniaxial or multi-axial along both axial and radial components of the optical fiber 8.

The description above indicates that a great degree of flexibility is offered by the described method and apparatus. Although the present invention has been described in considerable detail with reference to certain preferred versions thereof, other versions are possible. Therefore, the spirit and scope of the appended claims should not be limited to the description of the preferred versions contained herein.

What is claimed is:

1. A method for depositing an improved coating onto an optical fiber within a cylindrical magnetron without damaging said optical fiber, said method comprising the steps of:
   (a) generating a plasma cloud comprised of a plurality of dimensionally similar sputtered particles, said sputtered particles adhering to said optical fiber in a volume efficient arrangement, said cylindrical magnetron having an adjustable sputtering rate;
   (b) monitoring at least one environmental condition; and
   (c) adjusting said sputtering rate before said environmental condition exceeds a fiber damage threshold.

2. The method of claim 1, wherein said coating further comprises a first layer, a second layer, and a third layer, said first layer composed of a metal bonding to said optical fiber, said second layer composed of a thermal barrier material bonding to said first layer, and said third layer composed of an oxidation resistive metal bonding to said second layer.

3. The method of claim 1, wherein said coating is comprised of a plurality of layers, said coating having a pull strength of at least 2 pounds.

4. The method of claim 1, wherein said coating forms a compressively strained cover over said optical fiber.

5. The method of claim 1, wherein said coating closes micro-cracks along said optical fiber.

6. The method of claim 1, wherein said environmental condition is temperature.

7. The method of claim 1, wherein said environmental condition is pressure.

8. The method of claim 1, wherein said environmental condition is gas composition.

9. The method of claim 1, wherein said monitoring step is performed with a sensor.

10. The method of claim 1, wherein said monitoring step comprises measuring time during which said cylindrical magnetron is energized and de-energized.

11. The method of claim 1, wherein said adjusting step comprises alternately switching power between either an ON state or an OFF state to said cylindrical magnetron.

12. The method of claim 1, wherein said adjusting step comprises varying power to said cylindrical magnetron.

13. The method of claim 1, wherein said coating is applied onto at least one fiber segment.

14. The method of claim 1, further comprising the steps of:
- (d) cleaving said optical fiber; and
- (e) cleaning said optical fiber to form an optically clear pathway.

15. A method for depositing an improved coating onto at least one optical fiber within a plurality of cylindrical magnetrons without damaging said optical fiber, said method comprising the steps of:
- (a) generating a plasma cloud comprised of a plurality of dimensionally similar sputtered particles in at least one of said cylindrical magnetrons, said sputtered particles adhering to said optical fiber in a volume efficient arrangement, said cylindrical magnetrons each having an adjustable sputtering rate and coaxially aligned within a single vacuum chamber, said optical fiber movable between said cylindrical magnetrons;
- (b) monitoring at least one environmental condition; and
- (c) adjusting said sputtering rate before said environmental condition exceeds a fiber damage threshold.

16. The method of claim 15, wherein said coating further comprises a first layer, a second layer, and a third layer, said first layer composed of a metal bonding to said optical fiber, said second layer composed of a thermal barrier material bonding to said first layer, and said third layer composed of an oxidation resistive metal bonding to said second layer.

17. The method of claim 15, wherein said coating is comprised of a plurality of layers, said coating having a pull strength of at least 2 pounds.

18. The method of claim 15, wherein said coating forms a compressively strained cover over said optical fiber.

19. The method of claim 15, wherein said coating closes micro-cracks along said optical fiber.

20. The method of claim 15, wherein said environmental condition is temperature.

21. The method of claim 15, wherein said environmental condition is pressure.

22. The method of claim 15, wherein said environmental condition is gas composition.

23. The method of claim 15, wherein said monitoring step is performed with a sensor.

24. The method of claim 15, wherein said monitoring step comprises measuring time during which said cylindrical magnetron is energized and de-energized.

25. The method of claim 15, wherein said adjusting step is comprised of alternately switching power between either an ON state or an OFF state to said cylindrical magnetron.

26. The method of claim 15, wherein said adjusting step is comprised of varying power to said cylindrical magnetron.

27. The method of claim 15, wherein said coating is applied onto at least one fiber segment.

28. The method of claim 15, further comprising the steps of:
- (d) cleaving said optical fiber; and
- (e) cleaning said optical fiber to form an optically clear pathway.

* * * * *